June 7, 1960 R. G. ROCKWELL 2,940,002

KLYSTRON AMPLIFIER

Filed Jan. 2, 1958 3 Sheets-Sheet 1

INVENTOR.
Robert G. Rockwell
BY Paul B. Hunter
Attorney

June 7, 1960 R. G. ROCKWELL 2,940,002

KLYSTRON AMPLIFIER

Filed Jan. 2, 1958 3 Sheets-Sheet 2

INVENTOR.
Robert G. Rockwell

BY Paul B. Hunter
Attorney

June 7, 1960 R. G. ROCKWELL 2,940,002

KLYSTRON AMPLIFIER

Filed Jan. 2, 1958 3 Sheets-Sheet 3

INVENTOR.
Robert G. Rockwell
BY Paul B. Hunter
Attorney

United States Patent Office 2,940,002

Patented June 7, 1960

2,940,002

KLYSTRON AMPLIFIER

Robert G. Rockwell, Los Altos Hills, Calif., assignor to Varian Associates, Palo Alto, Calif., a corporation of California Filed Jan. 2, 1958, Ser. No. 706,735

10 Claims. (Cl. 315—5.46)

Figure 1:
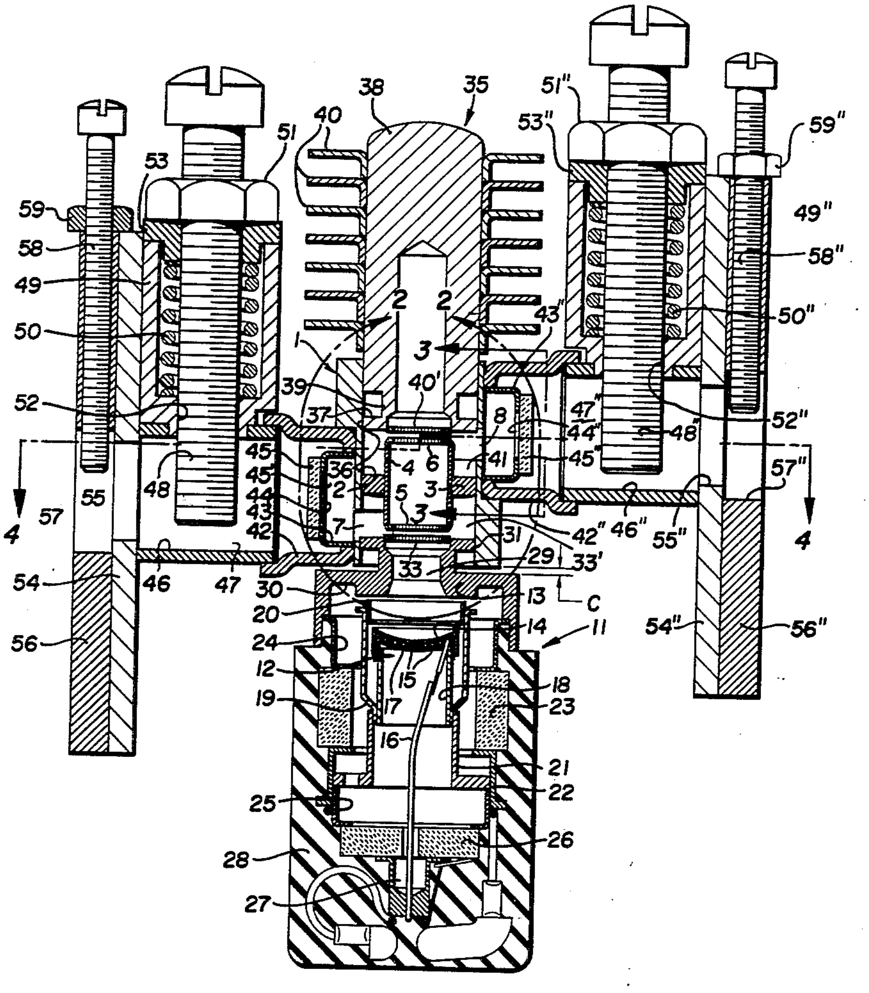

This invention relates in general to high frequency electron emissive devices and more particularly to a novel, externally tunable klystron amplifier which is relatively small in size, light in weight yet is sufficiently rugged and temperature compensated to perform well under present day environmental conditions.

Electronic systems in present day use require not only ease and accuracy of tuning over a specified frequency range, but must in addition be capable of retaining a vacuum seal while under substantially severe abuse. Heretofore, variable frequency klystron amplifiers have generally been tuned by plunger or movable end wall means wherein said means formed a part of the vacuum seal of the cavity resonator portion of the klystron. For optimum vacuum integrity and ruggedness it is extremely desirable to have a vacuum seal system wherein there are no moving portions forming the seal. This is achieved in the present invention by the employment of tunable external cavity resonators or resonator portions closely coupled to internal cavity resonators or resonator portions via rugged vacuum tight coupling means such that tuning of the klystron is confined to the external cavity resonator portions.

Whereas external tuning cavities closely coupled to internal cavities have been used in the past in reflex klystron oscillators the fruits of this conception have not lent themselves readily for use with klystron amplifiers. It is pointed out that the use of external tuning cavities directly coupled to internal cavity resonators leads to a loss of shunt impedance due to energy storage in regions other than the resonator grid gap where the beam interacts with the fields. This loss of circuit impedance is particularly important to the centimeter frequency range where impedance is already diminished due to the reduced dimensions of metal surfaces, a fortiori in the millimeter range.

The present applicant has successfully constructed a klystron amplifier employing externally tuned cavities or cavity portions wherein a novel coupling means between the internal and external cavities not only forms the vacuum seal but serves as transformer means between said cavities thereby substantially compensating for the loss of circuit impedance and in addition maintains a high electric field at the grid gap and also suppresses higher order modes.

The principal object of the present invention is to provide a very small, lightweight and extremely rugged klystron amplifier with relatively high gain over a range of frequencies in the centimeter band.

One feature of the present invention is the provision of a novel klystron having at least one internal cavity resonator and at least one external cavity resonator closely coupled to said internal cavity resonator by the intermediary of a novel transformer.

Another feature of the present invention is the provision of a novel klystron of the above featured type wherein the external cavity resonator includes tuning means.

Another feature of the present invention is the provision of a klystron of the above first featured type wherein the coupling means between the internal and external cavity resonators serves the combined functions of forming vacuum seal between the internal and external cavities and of providing novel translating coupling means which achieves optimum coupling between the two cavity resonators.

Still another feature of the present invention is the provision of a novel translating coupling means between internal and external cavity resonators comprising a window mounting cup made from a metal which has substantially the same coefficient of expansion as the ceramic member it supports thereby substantially reducing the possibility of leaks.

Still another feature of the present invention is the provision of a novel mechanical design for varying as desired the resonator gap width after the tube has been evacuated.

A further feature of the present invention is the provision of a novel cathode assembly wherein an insulator member serves the combined functions of an extremely rugged cathode support member and high voltage seal so disposed such that it is physically shielded from the heater element thereby eliminating voltage breakdowns caused by deposits of conductive material evaporated from the heater.

Figure 2:
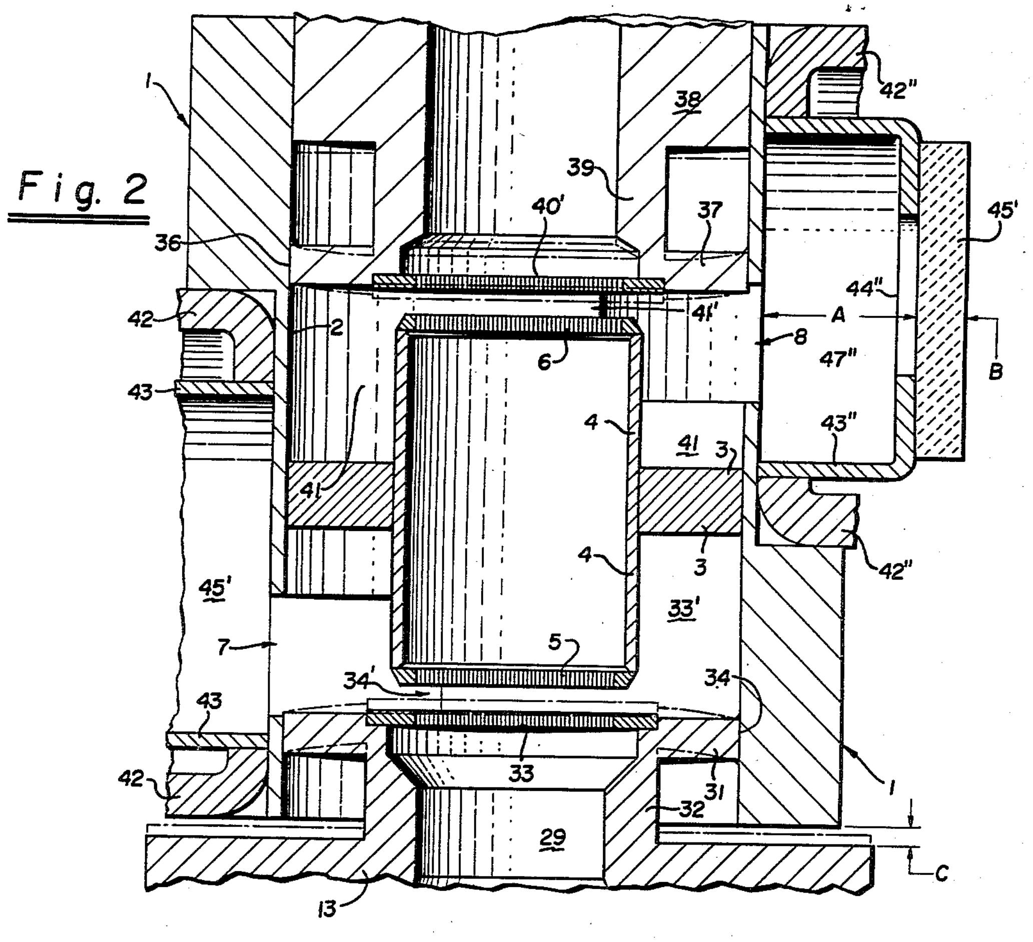
Figure 3:
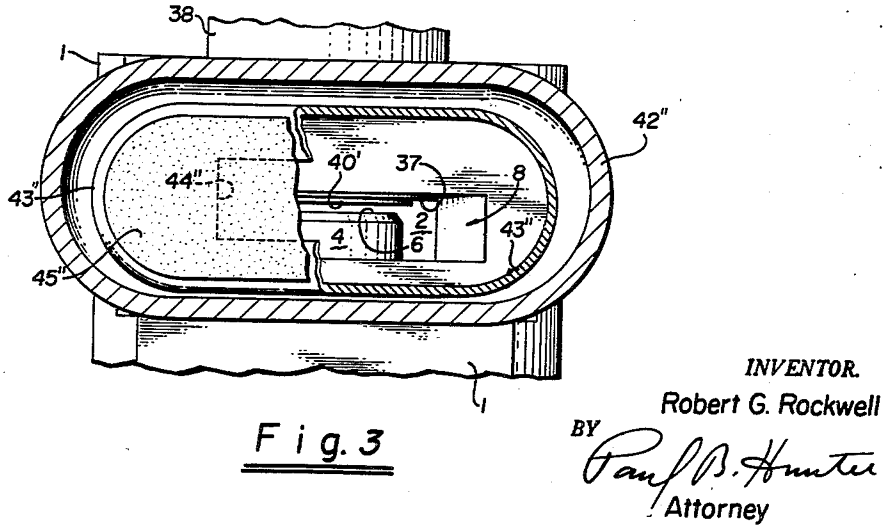
Figure 4:
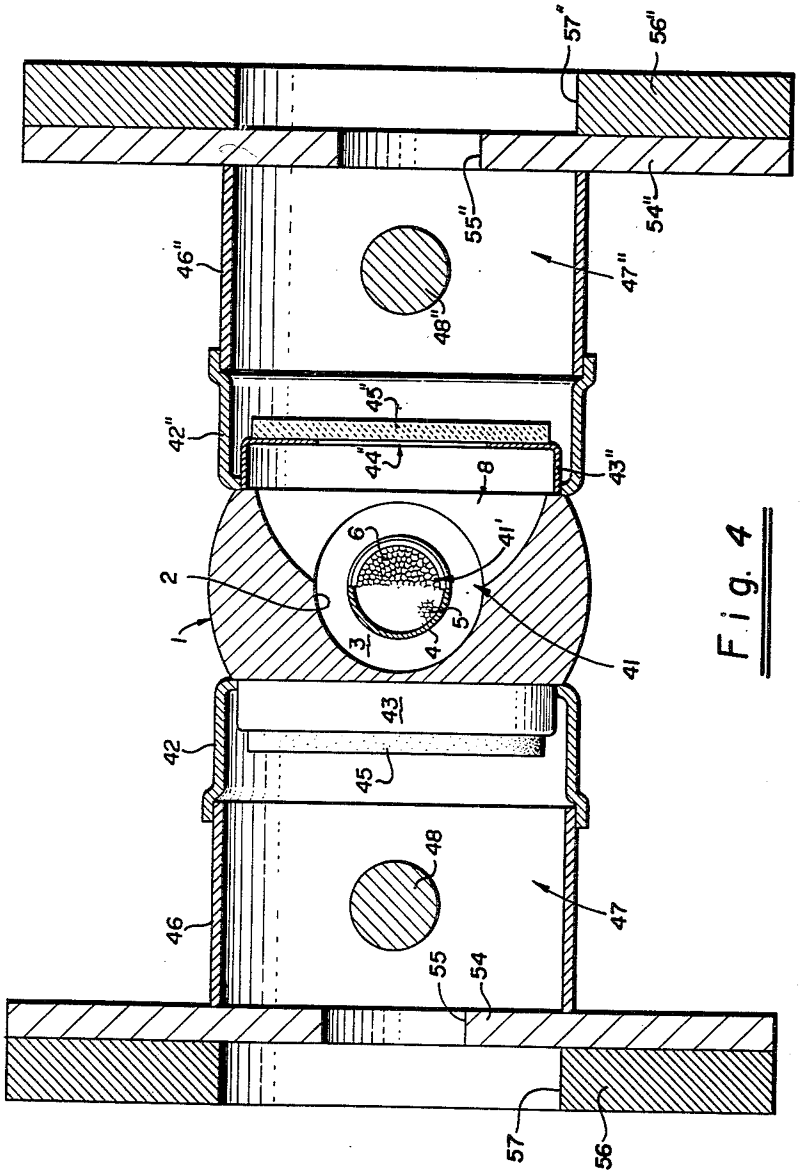

These and other features and advantages will be more apparent after a perusal of the following specification taken in connection with the accompanying drawings wherein, Fig. 1 is a longitudinal cross section view of a novel klystron amplifier embodying the present invention, Fig. 2 is an enlarged section taken along line 2—2 in Fig. 1 showing the mechanical provision for adjustment of the input and output interaction resonator gaps, Fig. 3 is a sectional view of the novel coupling means between the internal and external cavities taken along section line 3—3 in Fig. 1 and, Fig. 4 is a section view of the novel klystron amplifier taken along section line 4—4 in Fig. 1.

Referring now to the drawings, the present invention includes a central body portion 1 which is made from a unitary block of metal having a longitudinal bore 2 extending therethrough in which an annular header 3 is securely mounted. A drift tube 4 having resonator grids 5 and 6 on the ends thereof is secured in the annular header 3. Milled openings 7 and 8 are located in the opposite side walls of the central body portion 1 adjacent the opposite end portion thereof.

Fixedly secured as by brazing within the inner bore 2 of the central body portion 1 and sealing off one end thereof is a beam generating assembly 11 comprising an electron emission structure 12 and an anode structure 13. The electron emission structure 12 includes a cathode button member 14, indirect heating coil 15 connected to heater lead 16, parabolic heat reflecting cup member 17 fixedly secured at its flanged edge as by brazing to the cathode button 14, and cylindrical member 18 which serves as a heat shield and also as a support for both the cathode button 14 and the heater support 17 secured thereto. Member 18 is fixedly supported at its outer end on a coaxially disposed cylindrical sleeve 19 which also serves as a support member and heat shiled for the cylindrical beam focus electrode 20, sleeve member 19 in turn being brazed onto a cylindrical support member 21. A cylindrical stem socket member 22 is fixedly secured as by brazing to the cathode support member 21 and to one end of an annular ceramic member 23, ceramic member 23 serving the combined functions of electrical insulator and vacuum seal. In addition to being mechanically simple and extremely rugged, the ceramic member 23 is shielded from the heater element such that conductive material emitted by the heater element cannot deposit on it and cause voltage breakdowns, a defect which has been prevalent in the prior art. The other end of ceramic member 23 is fixedly secured as by brazing to a cylindrical cathode stem cup member 24. A cylindrical stem cup member 25 is fixedly secured to support member 21 at one end thereof and to a ceramic seal member 26 at the other end which in turn supports heater pin terminal 27. Encasing the entire electron emission structure 11 is a dielectric insulating material 28 such as, for example, silicon gum polymer.

Fixedly secured as by brazing to the cylindrical cathode stem cup 24 of the electron emission structure 11 is a unitary metallic anode member 13 having a flared inner cylindrical longitudinal bore 29 and consisting of a cylindrical end section 30 joined to a cylindrical section 31 via the reduced diameter portion 32. A resonator grid 33 is secured to the anode member and, in conjunction with resonator grid 5, drift tube 4 and header 3, forms the first or buncher cavity resonator 33'.

The beam generating assembly 11 is fixedly secured as by brazing to central body portion 1 solely along the peripheral surface 34 of cylindrical section 31. This design feature permits the interaction gap 34', to become shortened by the application of axial force to the beam generating assembly 11 which distorts cylindrical section 31 making it permanently convex with respect to the said assembly 11, thereby providing for tuning the cavity resonator 33' within the physical range of distance C after the klystron has been vacuum pumped (see Fig. 2).

A collector assembly 35 is fixedly secured as by brazing within the other end of bore 2 in the central body portion 1 along surface 36 of cylindrical end portion 37. The collector assembly 35 also includes an outer cylindrical end portion 38 joined to the inner cylindrical end portion 37 via a reduced diameter connecting section 39, and a fin assembly comprising annular fin members 40 brazed to cylindrical portion 38. A resonator grid 40' is mounted on collector end 37 and together with grid 6, header 3 and drift tube 4 form catcher or output cavity resonator 41. It is pointed out that the cylindrical portion 38 is not secured to the central body portion 1 and can therefore move axially within the inner bore of the central body portion by the application of axial force to the collector assembly 35. Such a movement deforms the cylindrical member 37 so as to make it permanently convex with respect to the collector assembly 35 thereby shortening the interaction gap 41' (see Fig. 2) to permit tuning of the output cavity 41 after the klystron has been vacuum pumped.

An input waveguide cup 42 is fixedly secured as by brazing to the central body portion 1 and houses an ovaloid metallic window frame 43 such as, for example, platinum having a rectangular window opening 44 and a wave permeable member 45 as of, for example, alumina ceramic fixedly secured as by brazing to the window frame 43 such that the window 44 is completely covered and forms a vacuum seal. The frame 43 defines an extension 45' of cavity resonator 33'. A waveguide section 46 is fixedly secured to the waveguide cup 42 and encloses an external cavity resonator 47 which is tightly coupled to the evacuated internal cavity resonator 33', 45' through large iris 44 and is tuned by tuning screw 48. Because the two cavities 47 and 33' are tightly coupled, they act as a single resonator in that tuning the external cavity 47 tunes the combination of members 47 and 33'. Tuning is provided by a rugged yet convenient tuner. Since cavity 47 is not evacuated, a single machine screw 48 housed in cylindrical sleeve 49 protruding through a wall of waveguide section 46 and held firmly in place by suitable spring loading provided by spring 50 and lock nut 51 forms the tuner. Since the portion of the resonator inside the vacuum is not tuned except during manufacture, it can be made very rugged. The threaded tuning screw 48 is retained in position by its mating with threading 52 on cylindrical member 49. An annular metallic member 53 serves to retain the spring 50 within the cylindrical section 49 and also serves as a rugged locking device whereby spring force is exerted against member 53 and this force is translated to nut 51 such that there is relatively great resistance to any rotation of nut 51 even under severe vibration.

Fixedly secured as by brazing to the waveguide section 46 is a flange member 54 having a cylindrical bore 55 therethrough which is centered equidistant from the end walls of waveguide section 46. Flange member 54 is in turn fixedly secured to a second flange member 56 having an ovaloid bore 57 therethrough which is coaxial with bore 55 of flange member 54, and serves as a matching iris to waveguide flanges which can be subsequently affixed to flange member 56. Flange member 56 also includes a threaded bore from one end thereof which houses a matching screw 58 which can be extended into the matching iris 57, the matching screw being secured by nut 59.

Secured over the opening 8 into the second cavity resonator 41 is an assembly of apparatus similar to that secured over opening 7 of cavity 33' and like parts bear like reference numerals double primed.

In operation, the electron emission structure 12 provides a beam of electrons which is directed axially through the central body portion via the flared apertured anode 13. Radio frequency power is fed through the input external resonant cavity 47 via the coupling iris formed by the wave permeable member 45 and the window opening 44 into the internal resonant cavity 33' and its extension 45' where is produces fields that velocity modulate the electron beam at the resonator gap 34' causing the electrons to become bunched as they travel through the drift tube 4. The bunched beam gives up radio frequency energy to the output resonator cavity 41 which passes out through the tuned external resonator cavity 47'' to an external load. Electrons that have passed through the resonator gap of cavity 41 impinge on the collector electrode 38.

A novel radio frequency energy coupling means is employed twice within the klystron, first as a means to couple radio frequency energy from the external resonator cavity 47 to the internal resonator cavity 33', and secondly as a means for coupling radio frequency energy from the internal resonator cavity 41 to the external resonator cavity 47'', in both cases providing optimum coupling. The two coupling means are dimensionally identical and comprise window frame members 43 and 43'', rectangular windows 44 and 44'', and wave permeable members 45 and 45''. Due to the relatively unusual high efficiency of coupling radio frequency energy from external cavity resonator 47 to internal cavity resonator 33', and demonstrated quantitatively by the relatively substantial useful energy extracted from the external output cavity 47'', the characteristics of this novel coupling means evidence those of a complex transformer rather than those of a simple coupling device, the complex transformer coupling resulting in a band pass filter with sharp leading and trailing edge cutoffs. As a result of the complex transformer characteristics of the novel coupling means, a specified gain of at least 7.8 db throughout the frequency range of 9.4 to 10 kmc. is realized in the output external resonator cavity 47''. It is believed that the complex transformer accomplishes this relatively high gain by concentrating the electric field in the resonator gaps and in addition by discriminating against higher order undesired modes which would otherwise be excited by the higher harmonics of the beam current. It is further believed that there is probably not a unique coupling assembly that would have the desired characteristics of a complex transformer rather than those of a simple coupling device but for the particular distance A, namely .100±.005 inch of the inner surface of the wave permeable member 45'' from the opening 8 in the central body portion 1, and for the thickness B, of the wave permeable member 45'', namely .042±.001 inch, there appeared to be a unique shape and size of the rectangular opening 44'' namely .150±.001 inch by .350±.001 inch, in the window frame 43'' for optimum gain (see Fig. 2). Although any one of the above three dimensions determine the other two for optimum coupling characteristics, it is obvious that three different dimensions would likewise achieve optimum coupling. Platinum was chosen as the metal for the window mounting frames 43 and 43''. Because of the unusual ovaloid shape of the frame severe stresses are set up on the seal formed by the frames and the wave permeable members, 45 and 45'' respectively, and in order to minimize these stresses a relatively flexible metal, namely platinum, with a temperature coefficient nearly that of ceramic is desirable. Optimum operation appeared likewise dependent upon the equality of the resonator gap spacings 34' and 41'. Equal spacing of these gaps is readily achieved by the method described previously wherein axial forces applied to the beam generating assembly 11 and the collector assembly 35 cause the respective gaps to become shortened thereby allowing both for equality of gap spacings and for tuning of the first and second internal cavity resonators.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An electron discharge amplifier device comprising means for forming a beam of electrons, means for collecting the electron beam, first and second internal resonator means arranged along the beam path between said beam forming and collecting means for electromagnetic interaction with the beam of electrons passable therethrough, first and second external cavity resonator means electromagnetically closely coupled through coupling circuits to said first and second internal cavity resonators, respectively, through openings in the walls of said internal cavity resonators, the coupling circuits each forming a complex transformer means including a window frame spaced from said wall openings and extending across the coupling path between the internal and external cavity resonators, said frame having a substantially rectangular window opening therein and a wave permeable, vacuum sealing window sealed over said rectangular window opening, said coupling circuits serving for electromagnetically closely coupling said cavity resonator means to each other and for forming a bandpass filter with sharp leading and trailing edge cutoffs whereby the beam field interaction efficiency is substantially enhanced and undesired modes are suppressed thereby obviating the use of additional mode suppression means.

2. A device according to claim 1 wherein said window frame of the complex transformer means comprises a metallic cup-shaped frame member having said rectangular opening in the bottom surface of the cup, and wherein said permeable window is fixedly mounted on the outer surface of the bottom of said frame member and covering said rectangular opening.

3. A device according to claim 2 wherein said metallic frame member has substantially the same temperature coefficient as said wave permeable member thereby reducing the probability of seal leaks.

4. A device according to claim 2 wherein said metallic member is platinum.

5. A device according to claim 2 wherein said wave permeable member is alumina ceramic.

6. A device according to claim 2 wherein said frame member of the complex transformer means comprises an ovaloid platinum frame member having said rectangular opening in the surface thereof, said frame member being .100±.005 inch in length, said rectangular opening being .150±.001 by .350±.001 inch.

7. An electron discharge device comprising a central body portion and including means for forming a beam of electrons and means for collecting said electrons, said central body portion containing therewithin first and second re-entrant internal cavity resonator means between said beam forming and collecting means for electromagnetic interaction with the beam of electrons passable therethrough, external cavity resonators heavily coupled electrically through wave energy permeable, vacuum sealing windows to said internal cavity resonators, tuning means in said external cavity resonators for tuning said coupled internal-external cavity resonators, a relatively thin conductive transverse wall member closing off one end of said central body portion and forming one end wall of said first internal cavity resonator means, said transverse wall member being deformable by the application of axial force thereto via the intermediary of said means for forming the electron beam whereby an interaction gap formed between the reentrant portion of said first internal cavity resonator and said transverse wall can be varied to fix tune said first internal cavity resonator to a desired frequency after the device has been evacuated.

8. An electron discharge device comprising a central body portion and including means for forming a beam of electrons and means for collecting said electrons, said central body portion containing therewithin first and second re-entrant internal cavity resonator means between said beam forming and collecting means for electromagnetic interaction with the beam of electrons passable therethrough, external cavity resonators heavily coupled electrically through wave energy permeable, vacuum sealing windows to said internal cavity resonators, tuning means in said external cavity resonators for tuning said coupled internal-external cavity resonators, a relatively thin conductive transverse wall member closing off one end of said central body portion and forming one end wall of said second internal cavity resonator means, said transverse wall member being deformable by the application of axial force thereto via the intermediary of said means for collecting the electrons whereby an interaction gap formed between the re-entrant portion of said second internal cavity resonator means and said transverse wall can be varied to fix tune said second internal cavity resonator to a desired frequency after the device has been evacuated.

9. An electron discharge device comprising a central body portion including means for forming a beam of electrons and including means for collecting said electrons, said central body portion containing therewithin first and second re-entrant internal cavity resonator means between said beam forming and collecting means for electromagnetic interaction with the beam of electrons passable therethrough, external cavity resonators heavily coupled electrically through wave energy permeable, vacuum sealing windows to said internal cavity resonators, tuning means in said external cavity resonators for tuning said coupled internal-external cavity resonators, first and second relatively thin conductive transverse wall members closing off both ends of said central body portion and forming one end wall of each of said first and second internal cavity resonators means, said transverse wall members being deformable by the application of axial force thereto via the intermediary of said means for forming the electron beam and said means for collecting the electrons whereby first and second interaction gaps formed between the re-entrant portions of said internal cavity resonators and said transverse wall members can be varied to fix tune said internal cavity resonators to a desired frequency after the device has been evacuated.

10. An electron discharge device comprising means for forming a beam of electrons and means for collecting said electrons, a central body portion containing therewithin first and second re-entrant internal cavity resonator means between said beam forming and collecting means for electromagnetic interaction with the beam of electrons passable therethrough, a first and second relatively thin conductive transverse wall member closing off both ends of said central body portion and forming one end wall of each of said first and second internal cavity resonator means, said transverse wall members being deformed by the application of axial force thereto via the intermediary of said means for forming the electron beam and said means for collecting the electron beam whereby first and second interaction gaps formed between the re-entrant portions of said internal resonators can be varied to fix tune said internal cavity resonators to a desired frequency after the device has been evacuated, first and second external resonator means, first and second complex transformer means including a wave permeable window and a window frame mounting member, disposed between each of said internal cavity resonators and each of said external cavity resonator means for electromagnetically closely coupling each of said external cavity resonator means to each of said internal cavity resonator means and forming a bandpass filter with sharp leading and trailing edge cutoffs whereby the beam field interaction efficiency of said internal cavity resonators is substantially enhanced and undesired modes are suppressed thereby obviating the use of additional mode suppression means, and means in said external cavity resonators for tuning the internal-external coupled resonators.

References Cited in the file of this patent

UNITED STATES PATENTS

| | | |
|---|---|---|
| 2,304,186 | Litton | Dec. 8, 1942 |
| 2,403,782 | Blumlein | July 9, 1946 |
| 2,789,250 | Varian et al. | Apr. 16, 1957 |
| 2,815,467 | Gardner | Dec. 3, 1957 |
| 2,824,258 | Snow et al. | Feb. 18, 1958 |
| 2,847,609 | Hamilton et al. | Aug. 12, 1958 |